United States Patent [19]

Arakawa et al.

[11] Patent Number: 5,590,073
[45] Date of Patent: Dec. 31, 1996

[54] RANDOM ACCESS MEMORY HAVING FLASH MEMORY

[75] Inventors: Hideki Arakawa; Takashi Narikiyo, both of Kanagawa, Japan

[73] Assignee: Sony Corporation, Japan

[21] Appl. No.: 345,695

[22] Filed: Nov. 21, 1994

[30] Foreign Application Priority Data

Nov. 30, 1993 [JP] Japan .................. 5-300678

[51] Int. Cl.[6] .......................... G11C 11/34
[52] U.S. Cl. .............. 365/185.08; 365/185.33; 365/228; 365/230.03; 365/230.05
[58] Field of Search .................. 365/181, 182, 365/184, 185, 228, 230.03, 230.05, 185.33, 185.08

[56] References Cited

U.S. PATENT DOCUMENTS

| | | | |
|---|---|---|---|
| 4,943,944 | 7/1990 | Sakui et al. | 365/189.05 |
| 5,197,026 | 3/1993 | Butler | 365/185 |
| 5,343,437 | 8/1994 | Johnson et al. | 365/228 |
| 5,412,612 | 5/1995 | Oyama | 365/228 |

FOREIGN PATENT DOCUMENTS

| | | | |
|---|---|---|---|
| 60-49223 | 3/1985 | Japan | 365/228 |
| 4-176091 | 6/1992 | Japan . | |

*Primary Examiner*—David C. Nelms
*Assistant Examiner*—F. Niranjan
*Attorney, Agent, or Firm*—Ronald P. Kananen

[57] ABSTRACT

A semiconductor nonvolatile memory device including first and second bit lines, a buffer memory connected to the first and second bit lines, an electrically erasable programmable nonvolatile memory connected to the first and second bit lines, a writing latch circuit to which the first and second bit lines are connected in parallel and having a differential sensor type sense amplifier, and a switching circuit for switching the nonvolatile memory and the latch circuit to a nonconnected state at the time of operation of the buffer memory and switching the buffer memory and the latch circuit to a nonconnected state at the time of a writing or erasure operation on the nonvolatile memory.

24 Claims, 11 Drawing Sheets

RANDOM ACCESS MEMORY HAVING FLASH MEMORY

BACKGROUND OF THE INVENTION

1. Field of the Invention

The present invention relates to a random access semiconductor memory, more particularly to an electrically erasable programmable nonvolatile semiconductor memory device such as a flash memory.

2. Description of the Related Art

At the present time, flash memories are coming under attention as low cost, large capacity EEPROMs. Attempts are being made to realize ones of 16 Mbits. Further, improvements are being made so that instead of the complete erasure as in the past, erasure of specific sectors is made possible to thereby further increase the ease of use.

Flash memories, however, have a remarkably longer erasure time and write time compared with the speed of the CPU to restrict excess erasure and excess writing in addition to basic factors of writing/erasure.

At the present time, it takes 0.1 to 2 seconds for erasing 1 Mbit and 0.2 second/16 KB for writing.

A flash memory as a semiconductor memory device ideally should have no erasure operation and should be able to perform writing at a speed commensurate with the speed of the CPU like with an SRAM.

Also, a flash memory is limited in the number of rewriting. The number of rewriting in the current art is about $10^6$ at a maximum. From the application standpoint, however, there is a demand for use up to $10^6$ to $10^9$ times since even part of the capacity of the flash memory is enough.

As explained above, a flash memory has a slow rewriting speed and a durability of the number of rewriting of about $10^4$ to $10^5$.

Accordingly, in the past, there has been proposed a nonvolatile RAM (NVRAM) comprised of an SRAM (or DRAM) and an EEPROM, coupled one-to-one in each memory cell unit, which has the contents of the SRAM or DRAM written in the EEPROM in accordance with need.

Further, as a semiconductor nonvolatile memory device achieving both a higher speed of the write operation and a nonvolatile nature without the use of a battery, as disclosed for example in Japanese Unexamined Patent Publication (Kokai) No. 4-176091, there is known a device provided with a flash EEPROM as a nonvolatile memory device, a DRAM as a volatile memory device, a control circuit for making the contents of the two memory devices match in accordance with an external signal, an internal address bus electrically isolated from an external address bus by a signal from the control circuit, and an internal data bus also electrically isolated from the external data bus by a signal from the control circuit.

In this semiconductor nonvolatile memory device, data is transferred from the flash EEPROM to the DRAM when the device is first assembled into the processing unit. Normal reading and writing are performed with respect to the DRAM. Upon instruction from the CPU, the contents of the DRAM are cached in the flash EEPROM.

The conventional NVRAM, however, was comprised of an SRAM (or DRAM) and EEPROM coupled one-to-one in memory cell units, so became larger in size than the sum of the size of a simple DRAM (or DRAM) cell and size of an EEPROM cell. Due to costs and other problems, further, realization of a larger capacity was difficult.

Further, in the semiconductor nonvolatile memory device disclosed in Japanese Unexamined Patent Publication No. 4-176091, the flash EEPROM and DRAM are formed on different chips, so viewing the device as a whole, the write and erasure times of the flash EEPROM are slow and the timing of the writing and erasure and designation of commands become complicated.

SUMMARY OF THE INVENTION

The present invention was made in consideration of the above circumstances and has as its object the provision of a semiconductor nonvolatile memory device which is made simpler in circuit configuration, is able to perform read and write operations at a high speed, and can store and hold data without use of a backup power supply.

To achieve the above object, the semiconductor nonvolatile memory device of the present invention including first and second bit lines, a buffer memory connected to the first and second bit lines, an electrically erasable programmable nonvolatile memory connected to the first and second bit lines, a write latch circuit to which the first and second bit lines are connected in parallel and having a differential sensor type sense amplifier, and a switching circuit for switching the nonvolatile memory and the latch circuit to a nonconnected state at the time of operation of the buffer memory and switching the buffer memory and the latch circuit to a nonconnected state at the time of a write or erasure operation on the nonvolatile memory.

The semiconductor nonvolatile memory device of the present invention preferably has at least two buffer memories and nonvolatile memories.

Further, the capacity of the buffer memory is preferably set to a whole multiple of the size of the page to be written at one time in the nonvolatile memory.

The semiconductor nonvolatile memory device of the present invention may have the buffer memory comprised by a static RAM.

When the power is energized, the data may be written into and read from the static RAM and when the power is deenergized, the data held in the static RAM may be cached in the nonvolatile memory.

The semiconductor nonvolatile memory device of the present invention may also have the buffer memory comprised by a dynamic RAM.

The semiconductor nonvolatile memory device of the present invention may have the nonvolatile memory comprised of a first memory cell connected to a word line and the first bit line, a second memory cell connected to the word line common with the first memory cell and connected to the second bit line, and a means for holding the potential of either of the first and second bit lines at a first potential at a predetermined operation time and for setting the potential of the other bit line to a second potential given a difference with the first potential for a predetermined time.

The semiconductor nonvolatile memory device of the present invention may also have the nonvolatile memory comprised of a plurality of memory cell blocks connected to the first and second bit lines and have between the memory cell blocks and bit lines two selection transistors connected in cascade and selection gates provided to selectively connect the memory cell blocks and bit lines.

According to the present invention, both the buffer memory and the nonvolatile memory are of a so-called folded bit line type memory configuration and the two are connected through the same bit line.

Further, data held in the buffer memory is latched once at a latch circuit and then that latched data is transferred to and stored at the nonvolatile memory.

Also, according to the present invention, by adopting a configuration in which at least two buffer memories and nonvolatile memories are provided, the data written in one buffer memory comprised of an SRAM or DRAM is transferred to one of the nonvolatile memories. When writing data into the buffer memory, the corresponding erasure units of the nonvolatile memory are erased (first one time).

While data of another buffer memory is being transferred to the flash memory, data is written in the first buffer memory.

Further, according to the present invention, the buffer memory may be comprised of an SRAM. When the power is turned on, data is written into and read from the SRAM. When the power is turned off, the data held in the SRAM is evacuated to the nonvolatile memory.

That is, the SRAM of the buffer memory is used as an NVRAM.

Further, according to the present invention, the first and second bit lines may be held at the same potential at the time of precharging for example, but the second bit line is held at the first potential and the second bit line is set to a second potential higher than the first potential when reading from the first memory cell for example.

Further, according to the present invention, in a configuration where there are a plurality of memory cell blocks connected to the first and second bit lines, the state of connection between the blocks and the bit lines is controlled by selection gates comprised of two selection transistors connected in cascade.

BRIEF DESCRIPTION OF THE DRAWINGS

These and other objects and features of the present invention will become clearer from the following description of preferred embodiments with reference to the accompanying drawings, in which.

DESCRIPTION OF THE PREFERRED EMBODIMENTS

The preferred embodiments of the invention will now be explained with reference to the drawings.

Figure 1:
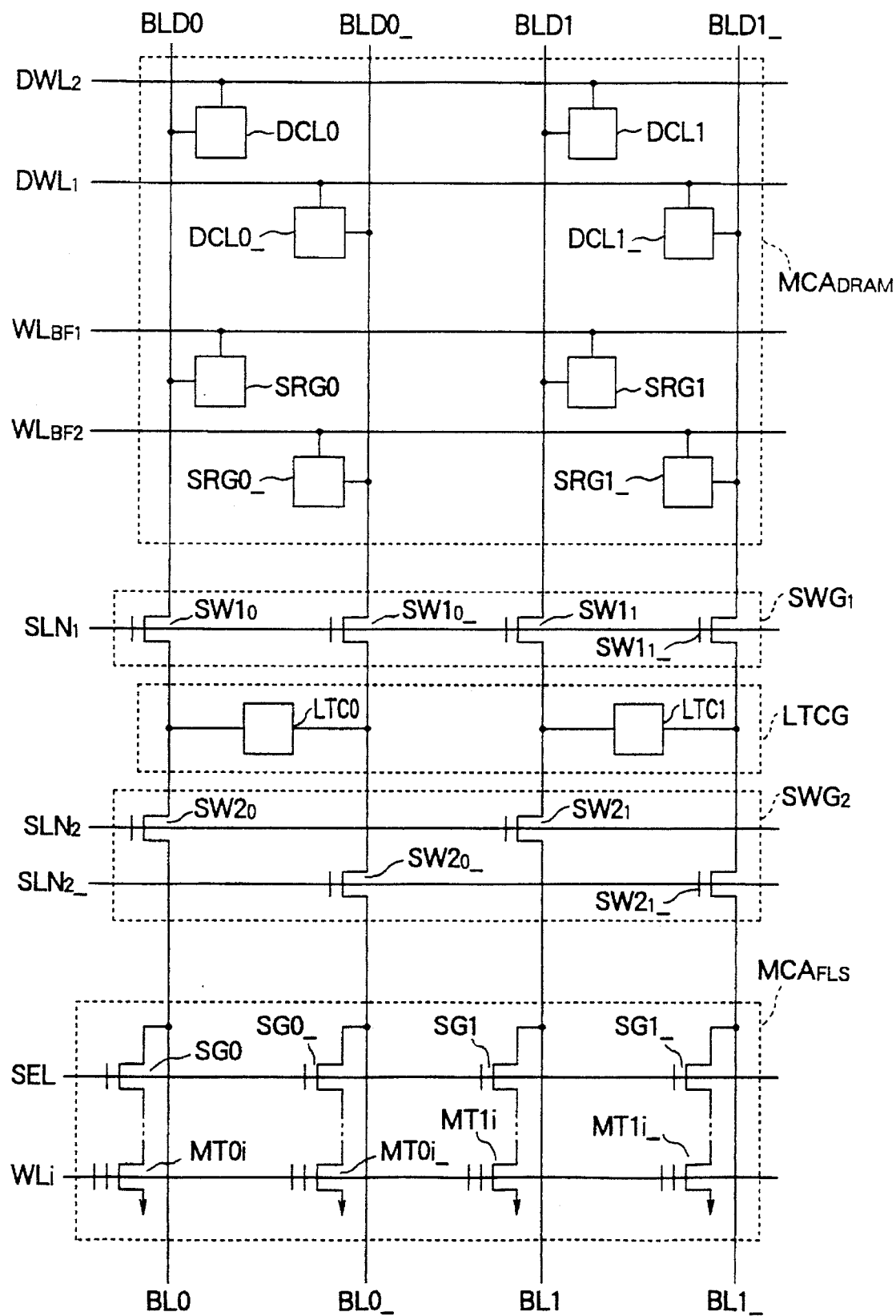
FIG. 1 is a circuit diagram of a first embodiment of a semiconductor nonvolatile memory device according to the present invention.

FIG. 1 is a circuit diagram of a first embodiment of a semiconductor nonvolatile memory device according to the present invention.

In FIG. 1, the $MCA_{DRAM}$ shows a DRAM cell array serving as a buffer memory cell array, $MCA_{FLS}$ a flash memory cell array serving as the nonvolatile memory cell array, $SWG_1$ a first switching device group, $SWG_2$ a second switching device group, LTCG a latch circuit group, BLD0 and BLD1 DRAM cell bit lines, BLD0_ an inverting bit line taking a complementary level to the bit line BLD0, BLD1_ an inverting bit line taking a complementary level to the bit line BLD1, $WL_{BF1}$ and $WL_{BF2}$ DRAM cell array word lines, $DWL_1$ and $DWL_2$ DRAM cell array dummy word lines, SEL a flash memory cell array selection gate line, WLi a flash memory cell array word line, $SLN_1$ a first switching signal line, and $SLN_2$ and $SLN_2$_ a pair of second switching signal lines.

The DRAM cell array $MCA_{DRAM}$ has a so-called folded bit line type memory configuration, which is advantageous in terms of increasing speed.

That is, it is configured in a so-called differential (including flipflop type) sense system with the bit lines BLD0 and BLD1 and the inverting bit lines BLD0_ and BLD1_ taking complementary levels with the same arranged diagonally. To produce the reference level of the differential sense amplifier, the inverting bit lines BLD0_ and BLD1_ at the opposite side to the side reading the data or the bit lines BLD0 and BLD1 have arranged at them the reference dummy cells DCL0_ and DCL1_ or DCL0 and DCL1 corresponding to the storage cells SRG0 and SRG1 or SRG0_ and SRG1_.

Figure 2:
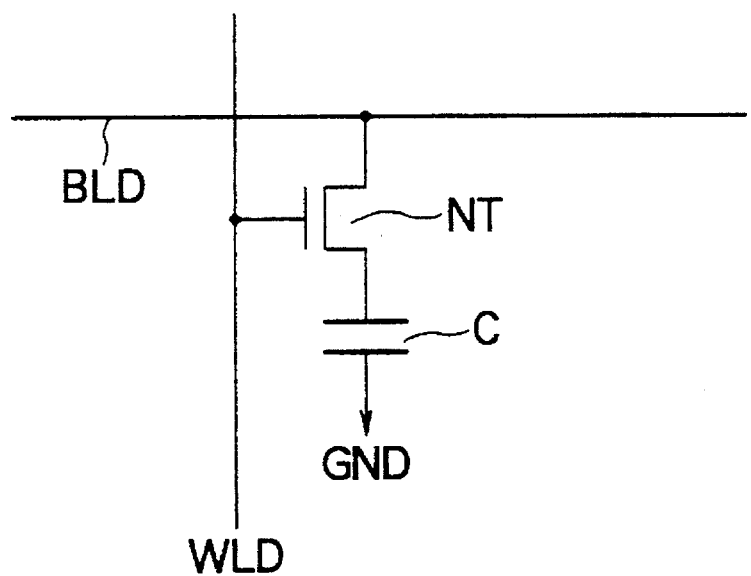
FIG. 2 is a view of an example of the configuration of a DRAM cell.

The storage cells SRG0, SRG1, SRG0_, and SRG1_ and the dummy cells DCL0, DCL1, DCL0_, and DCL1_ are each comprised, for example, as shown in FIG. 2, of a capacitor C for storing a charge and an nMOS transistor NT for controlling the charging and discharging of the capacitor C. One electrode of the capacitor C is grounded or fixed to a predetermined voltage. The other electrode is connected to the source of the nMOS transistor NT. The drain of the nMOS transistor NT is connected to the bit line BLD. The gate is connected to the word line WLD.

In such a configuration, if the potential of the word line is set to a high level by X-decoder (not shown), the nMOS transistor NT is turned on and becomes conductive and a charge is passed from the bit line BLD held to the predetermined potential to the capacitor C.

If the level of the word line WLD is lowered to the low level, the nMOS transistor NT is turned off and becomes non-conductive and the potential of the bit line BLD at that time is fetched into the capacitor C. As a result, data "1" or "0", each having the respective predetermined level, is held.

The flash memory cell array $MCA_{FLS}$ is comprised of nMOS transistors, that is, is composed of the memory transistors MT0$i$, MT0$i$_, MT1$i$, and MT1$i$_ connected in series with the selection gates SG0, SG0_, SG1, and SG1_ connected to the bit lines and inverting bit lines BL0, BL0_, BL1, and BL1_. That is, for example, NAND type memory cells are connected to the bit lines and the inverting bit lines BL0, BL0_, BL1, and BL1_. Further, the gates of the transistors forming the selection gates SG0, SG0_, SG1, and SG1_ are connected to a common selection gate line SEL. The gates of the memory transistors MT0$i$, MT0$i$_, MT1$i$, and MT1$i$_ are connected to a common word line WL$i$.

Note that the flash memory in this embodiment is based on the assumption of a memory of the Fowler-Nordheim (FN) tunnel erasure/FN tunnelwrite type.

The first switching device group $SWG_1$ is comprised of the switching devices $SW1_0$, $SW1_{0\_}$, $SW1_1$, and $SW1_{1\_}$ comprised of nMOS transistors and serially connecting the bit lines and inverting bit lines comprising the DRAM cell array $MCA_{DRAM}$ and the bit lines and inverting bit lines comprising the flash memory cell array $MCA_{FLS}$. More specifically, the bit lines BLD0 and BL0 are connected by the switching device $SW1_0$, the inverting bit lines BLD0_ and BL0_ are connected by the switching device $SW1_{0\_}$, the bit lines BLD1 and BL1 are connected by the switching device $SW1_1$, and the inverting bit lines BLD1_ and BL1_ are connected by the switching device $SW1_{1\_}$. Further, the gates of the transistors forming the switching devices $SW1_0$, $SW1_{0\_}$, $SW1_1$, and $SW1_{1\_}$ are connected to a common first switching signal line $SLN_1$.

The second switching device group $SWG_2$ is comprised of switching devices $SW2_0$, $SW2_{0\_}$, $SW2_1$, and $SW2_{1\_}$ comprised of nMOS transistors inserted serially at the bit lines and inverting bit lines BL0, BL0_, BL1, and BL1_ between the first switching device group $SWG_1$ and the flash memory cell array $MCA_{FLS}$. Further, the gates of the transistors forming the switching devices $SW2_0$, $SW2_{0\_}$, $SW2_1$, and $SW2_{1\_}$ are connected to common second switching signal lines $SLN_2$ and $SLN_{2\_}$.

The latch circuit group LTCG is comprised of a latch circuit LTC0 connecting in parallel the flash memory bit line BL0 and inverting bit line BL0_ and the latch circuit LTC1 connecting in parallel the bit line BL1 and inverting bit line BL1_, provided between the first switching device group $SWG_1$ and the second switching device group $SWG_2$. The latch circuits LTC0 and LTC1 are comprised of flipflop type sense amplifiers $SA_f$ connecting cross-wise the inputs and outputs of two CMOS inverters, for example, and function as flash memory sense amplifiers and function as write data latch circuits for temporarily holding write data of the buffer memory DRAM.

In this way, in this semiconductor nonvolatile memory device, even the nonvolatile memory flash memory is comprised of a folded bit line type memory advantageous for increasing speeds in the same way as a DRAM, said to be impossible in the past, and has a circuit configuration of bit lines and inverting bit lines comprising the DRAM cell array $MCA_{DRAM}$ and the bit lines and inverting bit lines comprising the flash memory cell array $MCA_{FLS}$ connected serially through the first switching device group $SWG_1$. Namely, the nonvolatile memory of the device is a so-called differential (including flipflop) sense type with the bit lines BL0 and BL1 and the inverting bit lines BL0_ and BL1_ taking complementary levels with the same arranged diagonally. As mentioned above, the latch circuits LTC0 and LTC1 function as differential type sense amplifiers.

Next, an explanation will be made of examples of the specific circuit configuration enabling use of the folded bit line system for a flash memory or other semiconductor nonvolatile memory using FIGS. 3 to 6 and the bit line BL0 and inverting bit line BL0_ as an example.

Figure 3:
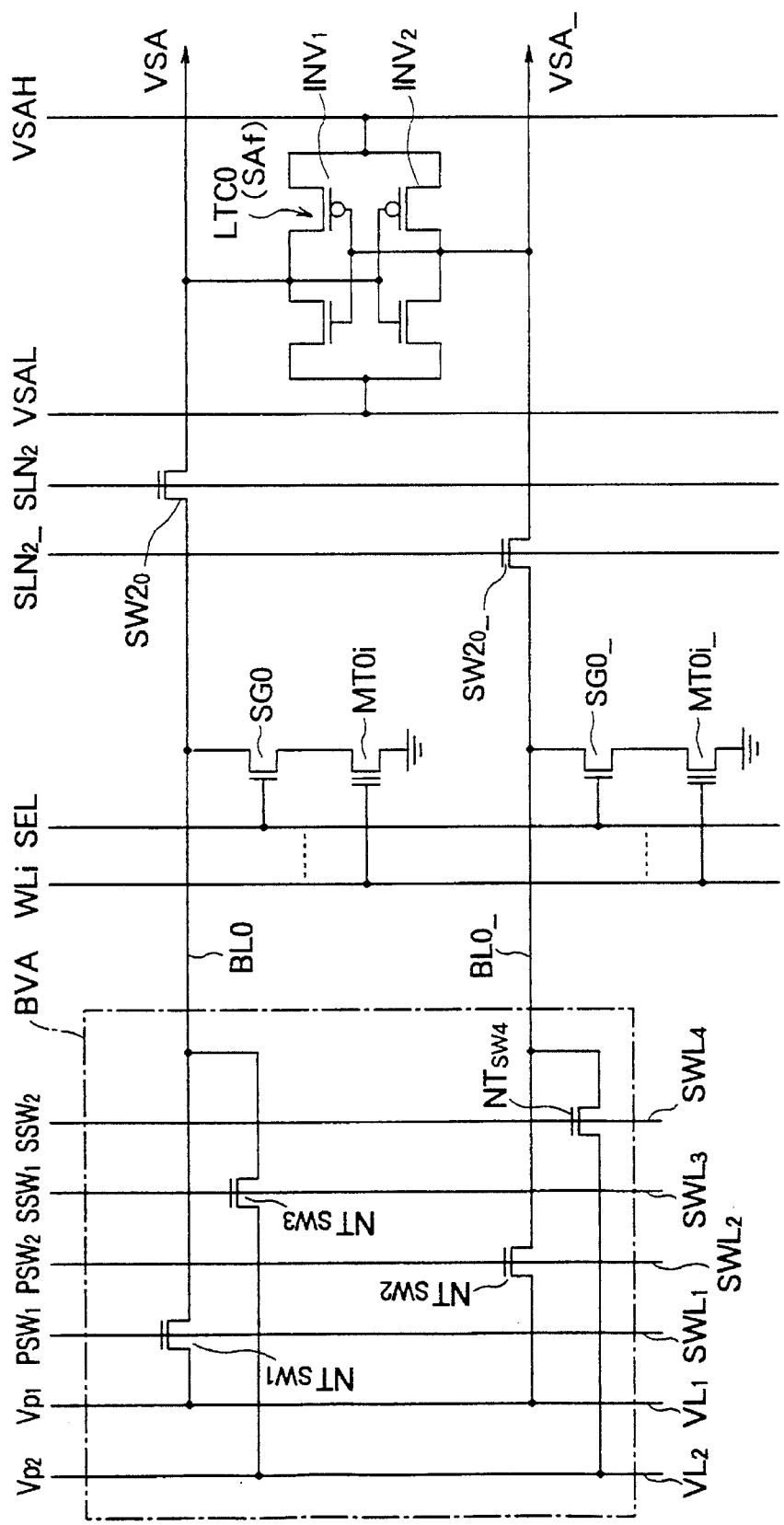
FIG. 3 is a circuit diagram of an example of the configuration of a flash memory able to adopt the folded bit line system without the use of dummy cells.
Figure 4:
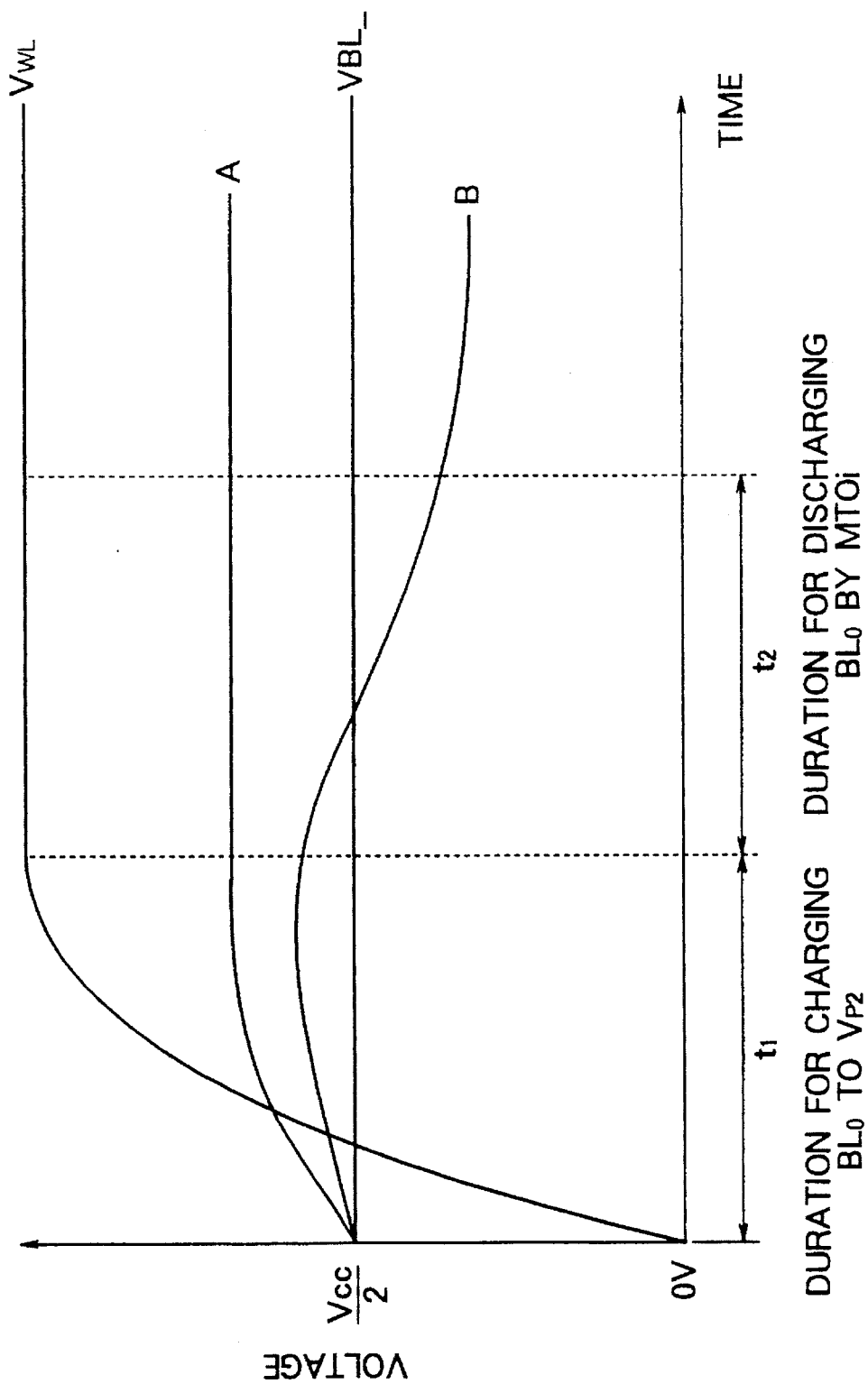
FIG. 4 is a view of the fluctuation of the bit line voltage caused by adjustment of the bit line voltage adjustment circuit at the time of a read operation in the circuit of FIG. 3.
Figure 5:
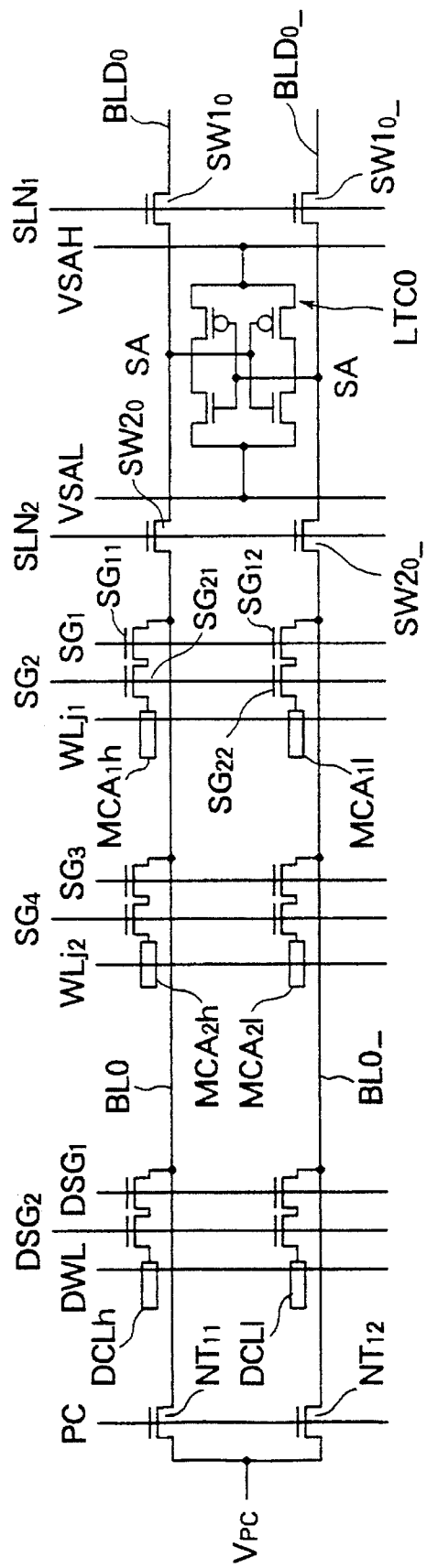
FIG. 5 is a circuit diagram of an example of the configuration of a flash memoryable to use the folded bit line system using dummy cells.

Note that here, FIG. 3 and FIG. 4 are used to explain an example of the configuration for enabling use of a folded bit line system without use of dummy cells, while FIG. 5 and FIG. 6 are used to explain an example of a configuration for enabling use of a folded bit line system with use of dummy cells.

FIG. 3 is a circuit diagram of an example of the configuration of a flash memory able to use the folded bit line system without the use of dummy cells.

This circuit is provided with a bit line voltage adjustment circuit BVA and enables use of the folded bit line system.

The latch circuit LTC0 functioning as the sense amplifier $SA_f$ is comprised, as shown in FIG. 3, of a flipflop sense amplifier comprised of two CMOS inverters $INV_1$ and $INV_2$ with inputs and outputs connected cross-wise. The output node of the inverter $INV_1$ is connected to the bit line BL0 and the output node of the inverter $INV_2$ is connected to the inverting bit line BL0_.

The bit line voltage adjustment circuit BVA is comprised of nMOS transistors $NT_{SW1}$ to $NT_{SW4}$, a first voltage supply line $VL_1$ which is a line for supplying a first voltage $V_{P1}$ from a not shown power supply, a second voltage supply line $VL_2$ which is a line for supplying a second voltage $V_{P2}$ from a not shown power supply, and first to fourth switching signal supply lines $SWL_1$ to $SWL_4$ which are lines for supplying the first to fourth switching signals $PSW_1$, $PSW_2$, $SSW_1$, and $SSW_2$ controlled in level by a not shown control system.

The nMOS transistor $NT_{SW1}$ is connected at its source to the first voltage supply line $VL_1$, at its drain to the bit line BL0, and at its gate to the first switching signal supply line $SWL_1$. The nMOS transistor $NT_{SW2}$ is connected at its source to the first voltage supply line $VL_1$, at its drain to the inverting bit line BL0_, and at its gate to the second switching signal supply line $SWL_2$. The nMOS transistor $NT_{SW3}$ is connected at its source to the second voltage supply line $VL_2$, at its drain to a point of connection between the bit line BL0 and the nMOS transistor $NT_{SW1}$, and at its gate to the third switching signal supply line $SWL_3$. The nMOS transistor $NT_{SW4}$ is connected at its source to the second voltage supply line $VL_2$, at its drain to a point of connection between the inverting bit line BL0_ and the nMOS transistor $NT_{SW2}$, and at its gate to the fourth switching signal supply line $SWL_4$.

The first voltage $V_{P1}$ supplied to the first voltage supply line $VL_1$ and the second voltage $V_{P2}$ supplied to the second voltage supply line $VL_2$ satisfy the following relationship when using the power source voltage as $V_{cc}$:

$$V_{P2} > V_{P1} = (V_{cc}/2) \tag{1}$$

FIG. 4 is a graph of the fluctuation of the bit line voltage $V_{BL}$ caused by adjustment of the bit line voltage adjustment circuit BVA at the time of a read operation.

In FIG. 4, the horizontal axis shows the time and the vertical axis the voltage. Curve A shows a bit line voltage in the case where no current is passed by the memory cell MT0$i$, while curve B shows a bit line voltage in the case where a current is passed by the memory cell MT0$i$.

When a read operation, the bit line BL0 (or the inverting bit line BL0_) to which is connected the memory cell performing the read operation is charged by the bit line voltage adjustment circuit BVA to the second voltage $V_{P2}$ higher than ($V_{cc}/2$) and the inverting bit line BL0_(or bit line BL0) is charged to the first voltage $V_{P1}$ of the level (½ $V_{cc}$).

The read operation of the data of the memory cell MT0i is performed as follows:

First, before the read operation, the signal levels are set as follows and the standby state is maintained. Namely, the first and second switching signals $PSW_1$ and $PSW_2$ are set to the high level by the not shown control system, and the third and fourth switching signals $SSW_1$ and $SSW_2$ are set to the low level. Further, the level of the word line WLi and the level of the second switching signals $SLN_2$ and $SLN_2$_ are set to the low level as well. As a result, the nMOS transistors $NT_{SW1}$ and $NT_{SW2}$ of the bit line voltage adjustment circuit BVA are turned on and the nMOS transistors $NT_{SW3}$ and $NT_{SW4}$ and the switching devices $SW2_0$ and $SW2_0$_ are turned off. The bit line BL0 and inverting bit line BL0_ are supplied with the first voltage $V_{P1}$ and are held to the ($V_{cc}/2$) level.

Further, VSA=VSA_=VSAL=VSAH=($V_{cc}/2$)

where, VSA is a voltage for driving the sense amplifier,

VSAL is a low voltage for driving the sense amplifier, and

VSAH is a high voltage for driving the sense amplifier.

When starting a read operation from the above standby state, the first switching signal $PSW_1$ is set to the low level and the third switching signal $SSW_1$ is set to the high level. Due to this, the nMOS transistor $NT_{SW1}$ is turned off and the nMOS transistor $NT_{SW3}$ is turned on. As a result, the supply of the first voltage $V_{P1}$ to the bit line BL0 is stopped and the supply of the second voltage $V_{P2}$ is started. That is, the charging of the voltage $V_{BL}$ of the bit line BL0 to $V_{P2}$ is started. At this time, the inverting bit line BL0_ continues to be supplied with the first voltage $V_{P1}$ and is held at the $V_{cc}/2$ level. Usually, $V_{P2}=V_{P1}+0.2$ to 0.5 V.

Next, the word line WLi is set to the high level (selection gate line SEL also high level).

Next, after a predetermined time, for example, 5 to 20 ns, elapses from when the word line WLi is set to the high level, the third switching signal $SSW_1$ is set to the low level. By this, the nMOS transistor $NT_{SW3}$ is turned off and the supply of the second voltage $V_{P2}$ to the bit line BL0 is stopped. In this state, if the memory cell MT0i passes a current for a predetermined time, for example 5 to 20 ns, the standby state is entered for the time where $V_{BL}<V_{P1}$.

After the elapse of this time, $V_{BL}<V_{P1}$ when the memory cell MT0i passes a current and $V_{BL}=V_{P2}$ when it does not pass it.

On the other hand, the bit line voltage $V_{BL}$_ of the inverting bit line BL0_ is connected at this time to the first voltage supply line $VL_1$, so the first voltage $V_{P1}$ is held regardless of if the memory cell MT0i passes a current or does not pass it.

Here, the levels of the first switching signal lines $SLN_2$ and $SLN_2$_ are set to the high level and the VSA and VSA_ are set with binary data of high/low in accordance with the memory cell MT0i.

In this way, according to the configuration of FIG. 3, it is possible to use the folded bit line system even when a memory cell MT0i connected to the bit line BL0 and the memory cell MT0l connected to the inverting bit line BL0_ are connected to a single word line WLi, without the use of dummy cells.

As a result, the layout is easier, direct connection of the bit lines and inverting bit lines of a folded bit line type DRAM is possible, and it is possible to easily form a DRAM and flash memory in the same chip. Further, various types of noise act in exactly the same way on the bit line BL0 and inverting bit line BL0_, so it is possible to suppress to a minimum the effect of the noise. Accordingly, it is possible to raise the sensitivity of the sense amplifier and thereby increase the speed.

Note that in this embodiment, the current of the memory cell MT0i_ can be completely compensated for by the first voltage $V_{P1}$, but considering manufacturing variations etc., the above circuit can be constructed if {current of memory cell MT0i>(current of memory cell MT0i_-current compensated by the first voltage $V_{P1}$)}.

Further, the circuit according to this embodiment can be applied to any type of flash memory whether the NAND type or NOR type.

Next, an explanation will be made of another example of the configuration using FIG. 5 and FIGS. 6A and 6B.

FIG. 5 is a circuit diagram of an example of the configuration of a flash memory able to use the folded bit line system using dummy cells.

In FIG. 5, $MCA_{1h}$ and $MCA_{2h}$ show memory cell arrays connected to the bit line BL0, $MCA_{1l}$ and $MCA_{2l}$ show memory cell arrays connected to the inverting bit line BL0_, $DCL_h$ shows a dummy cell connected to the bit line BL0, $DCL_l$ shows a dummy cell connected to the inverting bit line BL0_, and $NT_{11}$ and $NT_{12}$ show nMOS transistors.

Two upper side selection transistors is provided in an NAND type flash memory, one of them being a depletion transistor, so this circuit can use the folded bit line system. Dummy cells are used as the reference cells. This circuit has the same type of configuration as the folded bit line of the known DRAM circuit except that two selection gates are provided at each memory cell array.

FIG. 6 is a view of an example of the configuration of the memory cell array according to this embodiment.

Figure 6A:
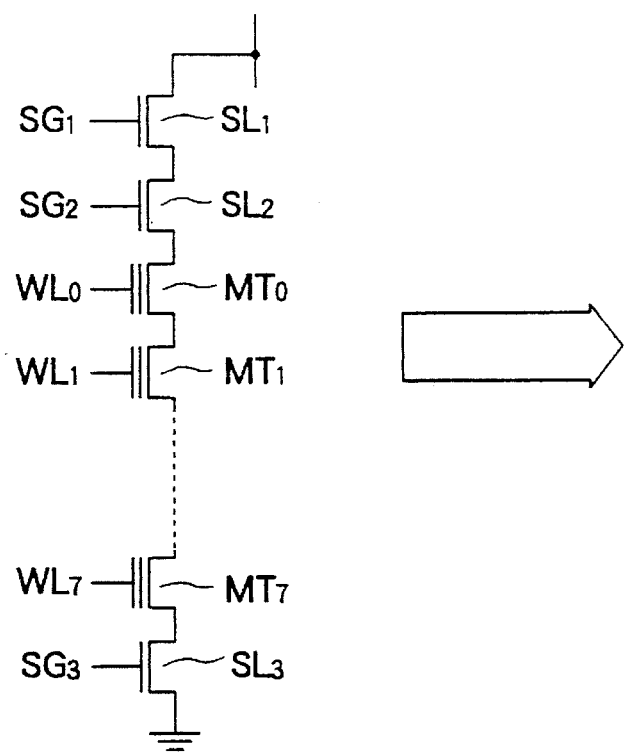
FIGS. 6A and 6B are views of an example of the configuration of the memory cell array of FIG. 5.

As shown in FIG. 6A, each memory cell array is comprised of the series-connected so-called upper side first and second selection transistors $SL_1$ and $SL_2$, a plurality of, for example, eight, memory transistors $MT_0$ to $MT_7$, connected in series with the second selection transistor $SL_2$, and series-connected so-called lower side selection transistors $SL_3$ between the memory transistor $MT_7$ and the ground. Further, one of the first and second selection transistors $SL_1$ and $SL_2$ is comprised by a depletion transistor.

In the memory cell array, the first selection transistor $SL_1$ is connected to the bit line BL0 or inverting bit line BL0_.

The first and second selection transistors $SL_1$ and $SL_2$ of the memory cell array connected to the same bit line BL0 or inverting bit line BL0_ are alternately comprised by depletion transistors in the order of connection from the sense amplifier side.

Figure 6B:
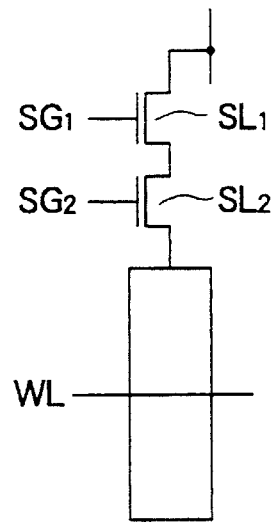

Note that in FIG. 5, for simplification of the illustration, the configuration of FIG. 6A is shown simplified as in FIG. 6B.

In the circuit of FIG. 5, the read operation of the data of the memory transistor connected to the selection gates $SG_{11}$ and $SG_{21}$ and connected to the word line WLj is performed as follows:

First, as an initial state, the levels of the supply line of the precharging signal PC and the first and second switching signal lines $SLN_1$ and $SLN_2$ are set to the low level (0 V). As a result, the nMOS transistors $NT_{11}$ and $NT_{12}$ and the switching devices $SW1_0$, $SW1_0$_, $SW2_0$, and $SW2_0$_ are turned off. Further, the inverted dummy selection gate signal DSG_ and the inverted selection gate signal SG_ are set to the low level, the word line WLj and the dummy word line DWL are set to the high level (5 V), the inverted high and low sense amplifier drive signals VSAL_ and VSAH_ are set to the inverted precharge signal $V_{PC}$_, and the bit line BLD0 and inverting bit line BLD0_ are set to (½)$V_{cc}$.

In this state, the inverted precharge signal PC_ and the second switching signal line $SLN_2$ are set to the high level, and, the nMOS transistors $NT_{11}$ and $NT_{12}$ and the switching devices $SW2_0$ and $SW2_0\_$ are turned on. As a result, the bit line BL0 and inverting bit line BL0_ are precharged to the precharge voltage $V_{PC\_}$.

Next, the word line of the substantially simultaneously selected cell is set to the low level and the selection gate signal SG_ is set to the high level. The dummy selection gate signal DSG_ of the dummy cell DMC connected to the inverting bit line BL_ is set to the low level and the signal SG_ is set to the high level. In this case, the signals SG2 and DSG1 are set to the high level and the word line WL and dummy word line DWL are set to the low level.

If the precharging ends, the signal PC_ is set to the low level. Due to this, the nMOS transistors $NT_{11}$ and $NT_{12}$ are turned off and the sense operation is started.

If the selected cell passes a current, the voltage $V_{BL}$ of the bit line BL0 falls, while if it does not, there is no change. On the other hand, the dummy cell DMC is set so as to pass an intermediate current, so the voltage $V_{BL}$ of the inverting bit line BL0_ falls somewhat. That is, if the selected cell passes a current, the voltage $V_{BL}$ of the bit line BL0 falls by a large amount.

About when the potential difference of the bit line BL0 and inverting bit line BL0_ becomes −0.1 V, VSAL_ and the second switching signal $SLN_2$ are set to the low level and VSAH_ is set to the high level. Due to this, the sense amplifier SA becomes the low level (0 V) and the sense amplifier SA_ becomes the high level (5 V) due to the operation of the flipflop type sense amplifier SAf.

Next, the first switching signal line $SLN_1$ is set to the high level. Due to this, the switching device $SW1_0$ and $SW1_0\_$ turns on and the sense amplifiers SA and SA_ are read out to the bit line BLD0 and inverting bit line BLD0_ of the DRAM memory serving as the buffer memory.

In this way, even if dummy cells are used, it is possible to construct a folded bit line type flash memory. Accordingly, in the same way as in the circuit of FIG. 3, the layout becomes easy, it is possible to directly connect the bit lines and inverting bit lines of the folded bit line type DRAM, and it is possible to easily form a DRAM and flash memory on the same chip.

Note that the circuit of this embodiment as well can be applied both to NAND type and NOR type flash memories.

Next, an explanation will be made of an example of the write operation of data in the configuration of FIG. 1.

For example, if the write operation to a normal DRAM ends, the level of the first switching signal line $SLN_1$ is set to the high level.

First, the memory cells SRG0 and SRG1 connected to the word line $WL_{BF1}$ are read out and the data of the same latched to the latch circuits LTC0 and LTC1.

Next, the level of the first switching signal line $SLN_1$ is set to the low level and the level of the second switching signal line $SLN_2$ is set to the high level ($SLN_2\_$ remains at low level). Due to this, the data latched at the latch circuits LTC0 and LTC1 are transferred to and stored in the flash memory cells MT0$i$ and MT1$i$.

In FIG. 5, the function of selecting a bit line when writing of the $SLN_2$ and $SLN_2\_$ in FIG. 1 is handled by the $SG_1$, $SG_3$, and $SG_4$ in FIG. 5.

As explained above, according to the present embodiment, a folded bit line type flash memory is constituted and the bit lines BL0 and BL1 and inverting bit lines BL0_ and BL1_ of the flash memory cell array $MCA_{FLS}$ are connected directly to the bit lines BLD0 and BLD1 and the inverting bit lines BLD0_ and BLD1_ of the folded bit line DRAM through the switching devices $SW1_0$, $SW1_1$, $SW1_0\_$, and $SW1_1\_$, so it is possible to easily form the DRAM and flash memory on the same chip.

Therefore, it is possible to realize a semiconductor nonvolatile memory device able to perform a read and write operation at a high speed and to store and hold data without use of a backup power supply.

In this configuration, there is no need for a refresh operation, usually required for a DRAM, the circuit is simplified, and therefore the cost can be reduced.

Figure 7:
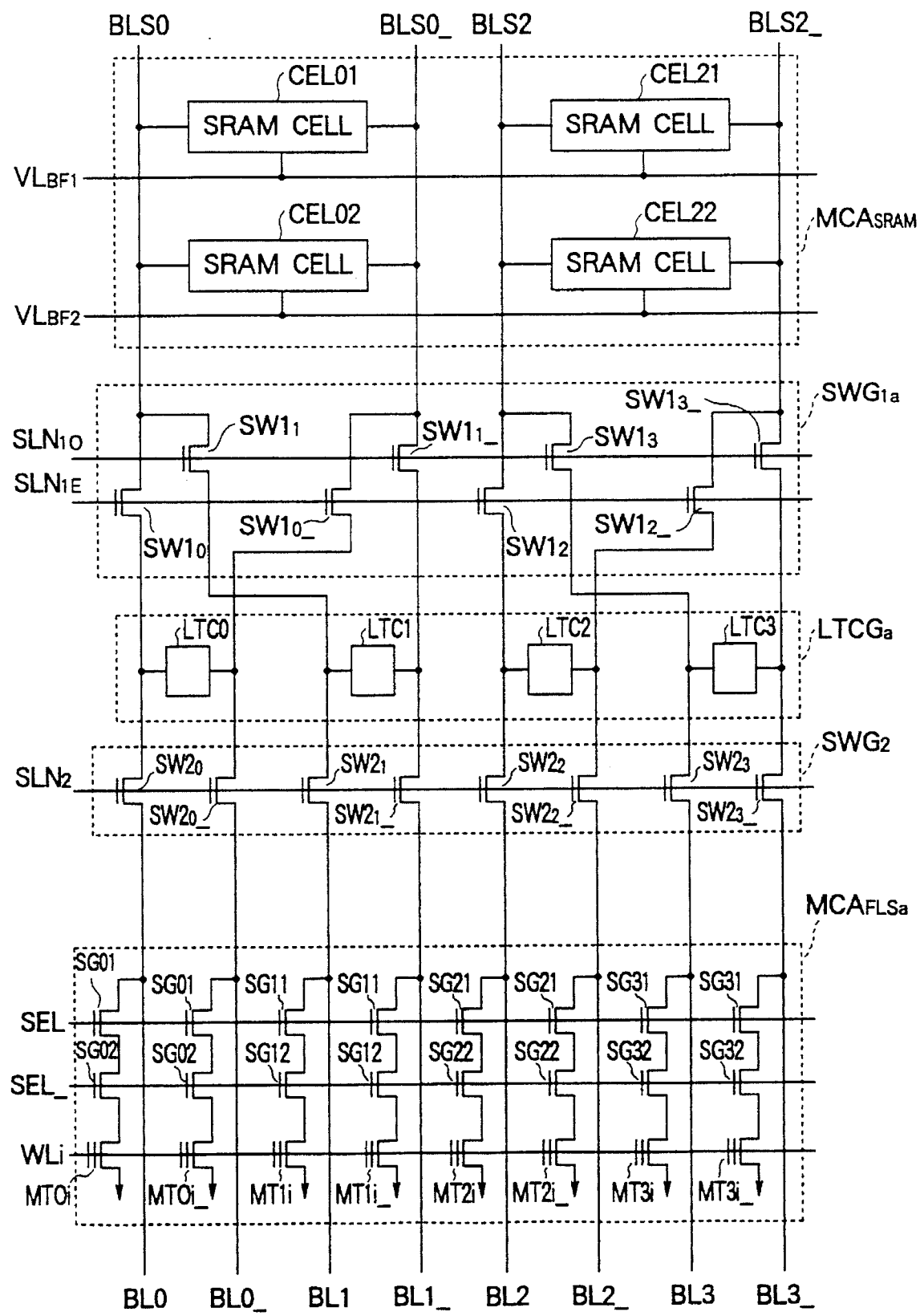
FIG. 7 is a circuit diagram of a second embodiment of a semiconductor nonvolatile memory device according to the present invention.

FIG. 7 is a circuit diagram of a second embodiment of a semiconductor nonvolatile memory device according to the present invention.

The point of difference of this embodiment with the first embodiment explained above is that use is made of an SRAM cell instead of a DRAM cell as the buffer memory.

Further, the bit line pairs of the SRAM cell array memory $MCA_{SRAM}$ and the bit line pairs of the flash memory cell array $MCA_{FLSa}$ are connected through a first switching device group $SWG_{1a}$.

Figure 8:
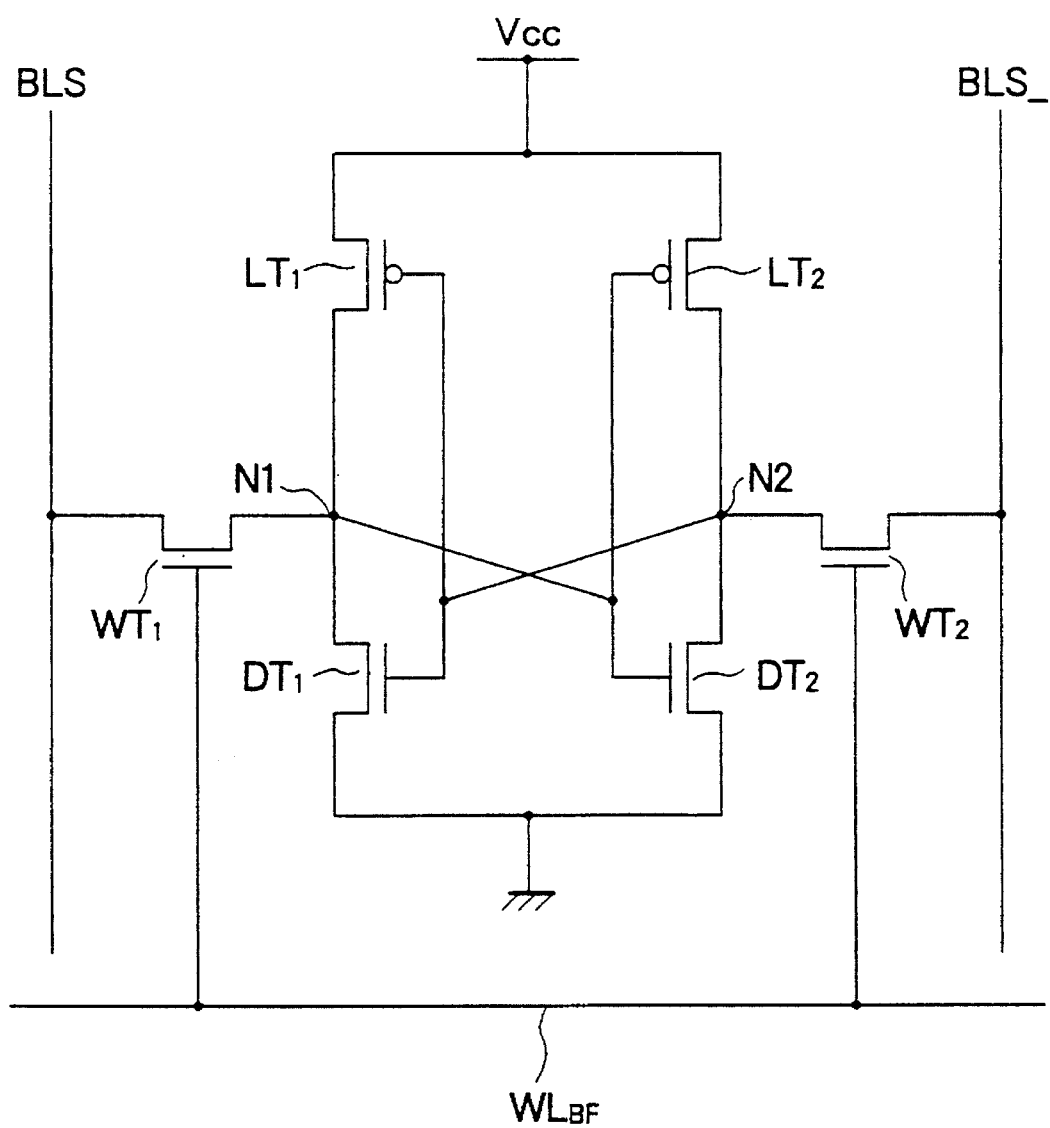
FIG. 8 is a view of an example of the configuration of an SRAM cell.

As the SRAM cells CEL01, CEL02, CEL21, and CEL22, use is made of TFT (thin film transistor) load type SRAMs as shown in FIG. 8 for example.

In such an SRAM, the drain and the gate of the load transistor $LT_1$ are connected with the drain and the gate of the driver transistor $DT_1$, respectively to comprise the first inverter, the drain and the gate of the load transistor $LT_2$ are connected with the drain and the gate of the driver transistor $DT_2$, respectively to comprise the second inverter, the first node $N_1$, that is, the output of the first inverter, is connected to the gate of the driver transistor $DT_2$, that is, the input of the second inverter, the second node $N_2$, that is, the output of the second inverter, is connected to the gate of the driver transistor $DT_1$, that is, the input of the first inverter, thereby comprising a basic memory cell.

In the SRAM, the first node $N_1$ is connected operatively by the word transistor $WT_1$ to the bit line BLS, and the second node $N_2$ is connected operatively by the word transistor $WT_2$ to the inverting bit line BLS_. Further, the gates of the word transistors $WT_1$ and $WT_2$ are connected to the word line $WL_{BR}$.

Further, in this device, there are two bit lines for the SRAM cell array $MCA_{SRAM}$, while there are four bit line pairs for the flash memory cell array $MCA_{FLSa}$. This is because the sizes of the memory cells of the SRAM and flash memory differ by about 2 times in horizontal width. The interval between a bit line and inverting bit line of an SRAM is double the interval between a bit line and inverting bit line of a flash memory.

Therefore, the first switching device group $SWG_{1a}$ has a two-stage construction of the switching devices $SW1_0$, $SA1_0\_$, $SW1_2$, and $SW1_2\_$ for connecting the even number row bit line pairs, that is, BL0, BL0_ and BL2, BL2_ to the bit line pairs of the SRAM cell array $MCA_{SRAM}$, that is, BLS0, BLS0_ and BLS2, BLS2_ and of the switching devices $SW1_1$, $SW1_1\_$, $SW1_3$, and $SW1_3\_$ for connecting the odd number row bit line pairs, that is, BL1, BL1_ and BL3, BL3_ to the bit line pairs of the SRAM cell array $MCA_{SRAM}$, that is, BLS0, BLS0_ and BLS2, BLS2_.

Further, the gates of the switching devices $SW1_0$, $SW1_0\_$, $SW1_2$, and $SW1_2\_$ are connected to a common switching signal line $SLN_{1E}$, and the gates of the switching devices $SW1_1$, $SW1_1\_$, $SW1_3$, and $SW1_3\_$ are connected to a common switching signal line $SLN_{1O}$.

In this configuration, two word lines' worth of the SRAM data can be stored in one word line's worth of a write data latch circuit LTC0 (to LTC3) of the flash memory at one time.

That is, 256 bytes to 512 bytes of SRAM data can be transferred to the flash memory in 0.1 to 1 ms.

Next, an explanation will be given of the case of transfer of SRAM data to the latch circuit using as an example the bit line pair BLS0 and BLS0.

First, the level of the bit line pair of the SRAM cell array $MCA_{SRAM}$, that is, the bit line BLS0 and inverting bit line BLS0_, is precharged to $V_{cc}/2$ by the not shown precharging circuit.

Next, the levels of the word lines $WL_{BF1}$ and $WL_{BF2}$ of the SRAM cell array $MCA_{SRAM}$ are set to the high level.

Due to this, one of the levels of the bit line BLS0 and the inverting bit line BLS0_ becomes 0 V due to the data of the SRAM cells CEL01 and CEL02. This is possible by making the time longer than the read operation.

Further, the levels of the word lines $WL_{BF1}$ and $WL_{BF2}$ are switched to the low level, the signal line $SLN_{1E}$ or $SLN_{10}$ of the first switching device group $SWG_{1a}$ is set to the high level, and the result is fetched into the latch circuit LTC0 or LTC1.

The data fetched into the latch circuit LTC0 or LTC1 is stored in the desired memory transistors $MT0i$, $MT0i\_$, $MT1i$, and $MT1i\_$ in accordance with the order of writing into the flash memory.

Further, the read operation of the data from the flash memory is performed in the same way as the operation explained using FIG. 3 to FIG. 6A.

As explained above, according to this embodiment, even when an SRAM is used as the buffer memory, like with the first embodiment, it is possible to easily form the SRAM and flash memory on the same chip and possible to obtain a similar effect as in the first embodiment.

Note that the latching of the write data may be performed using an SRAM sense amplifier instead of sharing the flash memory sense amplifier.

Figure 9:
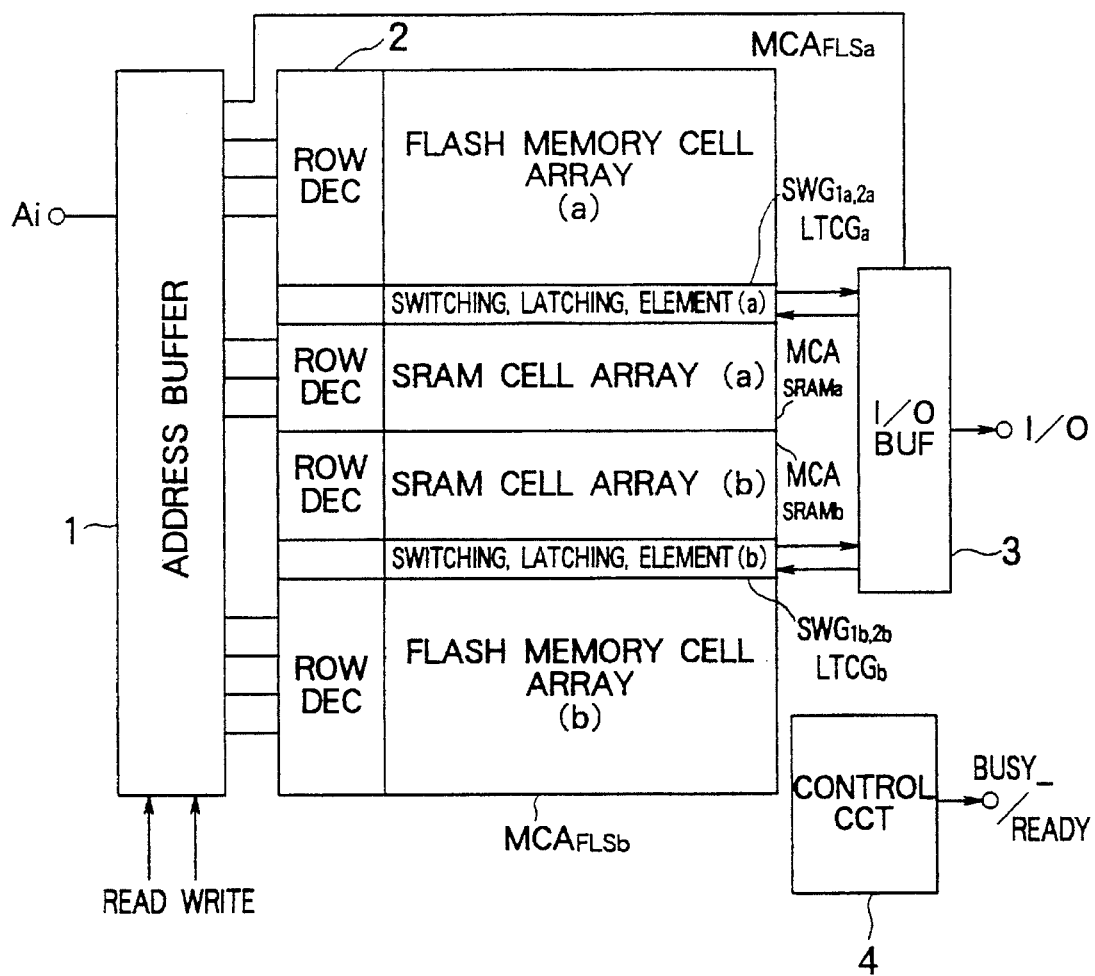
FIG. 9 is a block diagram of a third embodiment of a semiconductor nonvolatile memory device according to the present invention.

FIG. 9 is a block diagram of a third embodiment of a semiconductor nonvolatile memory device according to the present invention.

In this example, two of the SRAM-flash memory cell array pairs (a, b) shown in FIG. 7 are provided and continuous input made possible so that the erasure time of the flash memory becomes invisible and the write data is written in the SRAM.

Note that in FIG. 9, 1 shows an address buffer, 2 a row decoder, 3 an I/O buffer, and 4 a control circuit for controlling the circuit as a whole.

Figure 10A:
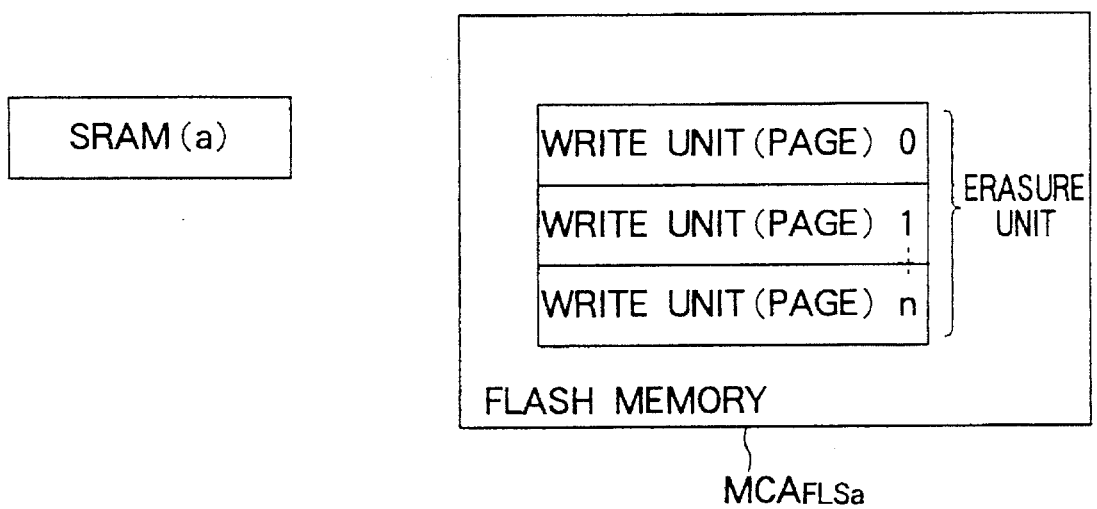
FIG. 10, comprised of FIGS. 10A and 10B is a view for explaining the relationship between the SRAM size and write units (pages) in the circuit of FIG. 9.
Figure 10B:
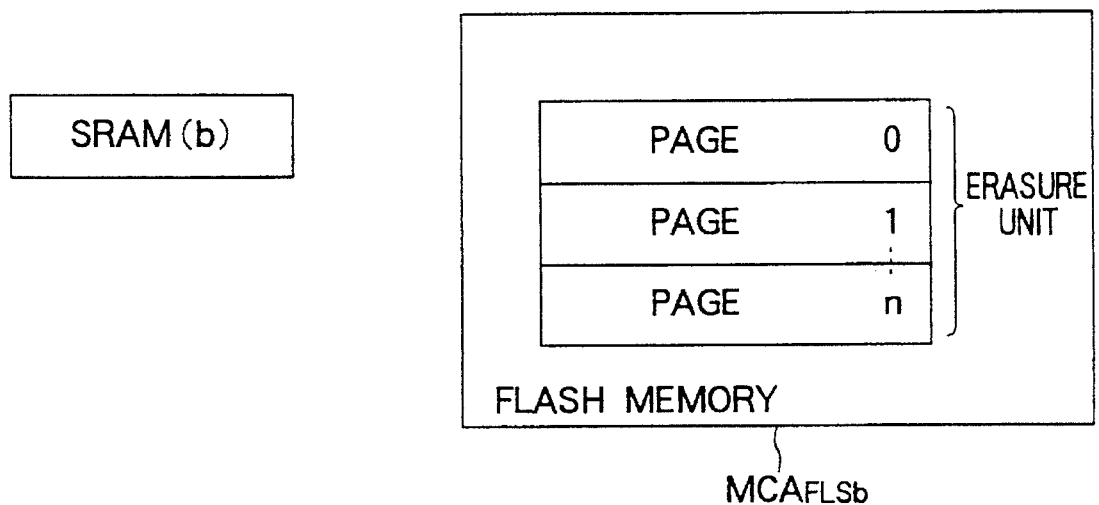

In this device, as shown in FIG. 10, the size (capacity) of the SRAM(a) and (b) is a whole multiple of the write unit (page).

Next, an explanation will be given step by step of the operation of the configuration of FIG. 9 when the size of the SRAM(a) and (b) is the same as the page size.

First, the writing is started. The write signal WRITE to the SRAM is input to the address buffer 1 and the input of the addresses and data is started.

Next, the input to the SRAM cells of the SRAM cell array $MCA_{SRAMa}$ is started. At the same time, the addresses of the erasure blocks are known from the higher address, so the erasure of those blocks of the flash memory cell array $MCA_{FLSa}$ is started.

Here, for example, if the page=SRAM size=512 bytes, with a cycle of 200 ns, about 0.1 ms is required for erasure, but this value is not an unreasonable one but a realistic one. Due to this, the input to the SRAM cell array $MCA_{SRAMa}$ is ended and the erasure operation of the corresponding blocks of the flash memory cell array $MCA_{FLSa}$ is ended.

Next, the input to the SRAM cell array $MCA_{SRAMb}$ is started and the erasure of the corresponding blocks of the flash memory cell array $MCA_{FLSb}$ is started.

At the same time, the writing from the SRAM cell array $MCA_{SRAMa}$ to the page of the flash memory cell array $MCA_{FLSa}$ is started.

In this case too, if the page=SRAM size =512 bytes, with a cycle of 200 ns, it is necessary to perform a write operation in about 0.1 ms, but this is a realistic value. Due to this, along with the end of the input to the SRAM cell array $MCA_{SRAMb}$, the erasure operation of the corresponding blocks of the flash memory cell array $MCA_{FLSb}$ is ended. At this time, the input to the SRAM cell array $MCA_{SRAMa}$ is ended and the transfer of data from the SRAM cell array $MCA_{SRAMa}$ to page 0 of the flash memory cell array $MCA_{FLSa}$ is ended.

Next, at the same time the input to the SRAM cell array $MCA_{SRAMa}$ is started, the transfer of data from the SRAM cell array $MCA_{SRAMb}$ to page 0 of the flash memory cell array $MCA_{FLSb}$ is started. In this case, no erasure operation is performed when the erasure blocks are the same as the time before. At this time, the input to the SRAM cell array $MCA_{SRAMa}$ is ended and the transfer of data from the SRAM cell array $MCA_{SRAMa}$ to the flash memory cell array $MCA_{fLSa}$ is performed.

Next, the input to the SRAM cell array $MCA_{SRAMb}$ is started. In this case too, no erasure operation is performed when the erasure blocks are the same as the time before.

These operations are then repeated.

For example, when the erasure unit is 8 kbytes (total 16 kbytes for flash memory cell arrays $MCA_{FLSa}$, and $MCA_{FLSb}$) and a page is 512 bytes (total 1 kbyte for flash memory cell arrays $MCA_{FLSa}$ and $MCA_{FLSb}$), 16 write operations are continuously performed after the initial erasure operation.

Next, an explanation will be made of the operation in the case of the (erasure time=writing time×16).

In this case, the size of the SRAM has to be 16-times the page size. In terms of the above example, the erasure unit=SRAM size=8 kbytes×2, writing takes 0.1 ms/page, and erasure takes 1.6 ms/16 kbytes.

In this case too, the time for writing in the SRAM equals the erasure time and the operation itself does not change.

when the operation is started, data is input to the SRAM cells of the SRAM cell array $MCA_{SRAMa}$. At the same time, the numbers of the erasure blocks are known from the higher address, so the erasure of those blocks of the flash memory cell $MCA_{FLSa}$ is started.

The input to the SRAM cell array $MCA_{SRAMa}$ is ended and data is transferred from the SRAM cell array $MCA_{SRAMa}$ to page 0 of the flash memory cell array $MCA_{FLSa}$.

Next, the input to the SRAM cell array $MCA_{SRAMa}$ is started and the erasure of the corresponding blocks of the flash memory cell array $MCA_{FLSb}$ is started.

Next, at the same time as the end of the transfer of data from page 0 of the SRAM cell array $MCA_{SRAM}$ to page 0 of the flash memory cell array $MCA_{FLSa}$, the transfer of data from page 1 of the SRAM cell array $MCA_{SRAMa}$ to page 1 of the flash memory cell array $MCA_{FLSa}$ is started.

The transfer of data is performed repetitively from page 0 to page 15.

At this time, in parallel with this, data is input to the SRAM cell array $MCA_{SRAMb}$ and erasure of the flash memory cell array $MCA_{FLSb}$ is performed.

Here, in parallel with the end of the transfer of data from page 15 of the SRAM cell array $MCA_{SRAMa}$ to page 15 of the flash memory cell array $MCA_{FLSa}$, the input of data to the SRAM cell array $MCA_{SRAMb}$ is ended and the erasure operation of the flash memory array $MCA_{FLSb}$ is ended.

Next, at the same time as the start of the transfer of data from page 0 of the SRAM cell array $MCA_{SRAMb}$ to page 0 of the flash memory cell array $MCA_{FLSb}$ is started, the input to the SRAM cell array $MCA_{SRAMa}$ is started.

The above operation is then repeated.

Note that in the above configuration, the erasure time or the write time to the flash memory is slightly longer compared with the SRAM input time, so it is possible to output the READY_/BUSY_ signal to the external control system from the control circuit 4.

As explained above, according to the present embodiment, it is possible to eliminate the waiting time, of the order of milliseconds, of the writing and erasure other than the data input as seen from the control system, that is, the CPU.

Further, when performing the reading of data from the flash memory during writing/erasure, the write data is held in the SRAM, so it is possible to suspend the operations of writing in the SRAM and erasure/writing in the flash memory and read out from the flash memory.

Accordingly, it is possible to change the usual repetition of the input of the erasure signal→waiting for erasure→input of write data→waiting for end of writing→waiting for input of write data→. . . to a repetition of input of write data→input of write data→. . .

This embodiment is similar in configuration to the configuration of the device of FIG. 7, but part of the flash memory is used as a nonvolatile RAM (NVRAM).

In this case, the SRAM cells are provided in units of whole multiples of the erasure blocks of the flash memory.

In this device, usually when used as an SRAM and when turning off the power source, the data is cached in the flash memory. The time for caching is about 0.1 msec per page, so the power in the capacitor is sufficient for caching. Further, when the power source is turned on, the data is read out automatically to the SRAM.

The specific page size etc. in this case is for example 1 page=256 bytes, the erasure block is set to 8 pages=2 kbytes, and the SRAM is set to 2 kbytes=15 kbits.

According to this embodiment, it is possible to use part of the flash memory as an NVRAM, so when the power is turned on, it is possible to use it as an SRAM and when the power is turned off, that part becomes a flash memory, so there is the advantage that a substantially unlimited writing flash memory can be realized, though only partially.

Figure 11:
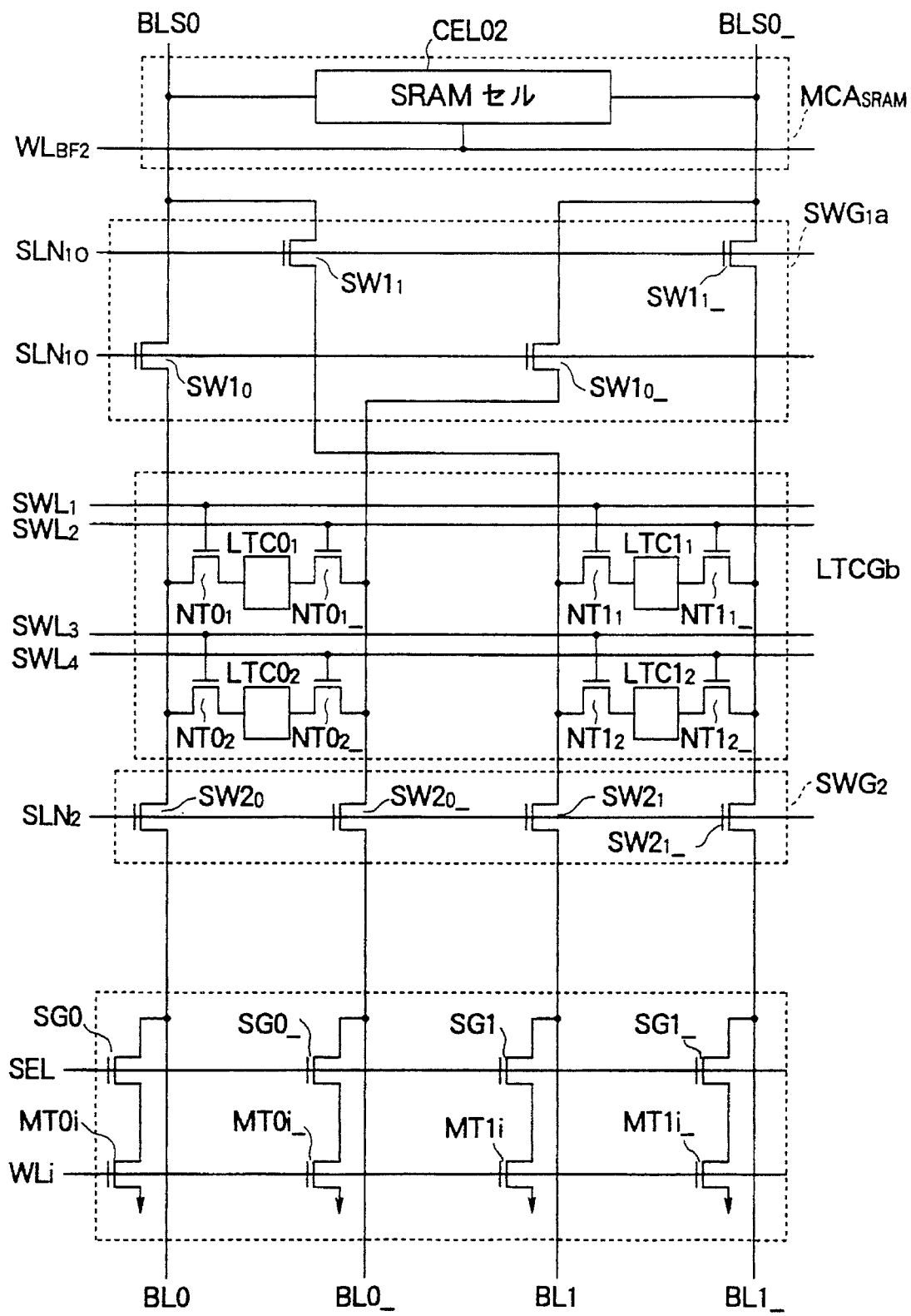
FIG. 11 is a circuit diagram of key parts of a fifth embodiment of a semiconductor nonvolatile memory device according to the present invention.

FIG. 11 is a circuit diagram of key parts of a fifth embodiment of a semiconductor nonvolatile memory device according to the present invention.

The device of this embodiment makes an improvement in the point that in the configuration of the second embodiment, while provision was made of the two bit line pairs BL0, BL0_ and BL1, BL1_ for the bit line pair BLS0 and BLS0_ of the SRAM cell array $MCA_{SRAM}$ in the flash memory cell array $MCA_{FLS}$, writing was only possible at the flash memory connected to one side, that is, the BL0, BL1 . . . or BL0_, BL1_, . . . and data of one word line of the flash memory had to be written divided into two.

Specifically, in the configuration of the latch circuit group LTCGb, the latch circuits are made two stage configurations, the connection of the latch circuits with the bit lines and the inverting bit lines is performed through nMOS transistors, and the gates of the nMOS transistors are connected to the switching signal lines $SWL_1$ to $SWL_4$. That is, the latch circuits $LTC0_1$ and bit line BL0 are connected by the nMOS transistor $NT0_1$, the latch circuit $LTC0_1$ and inverting bit line BL0_ are connected by the nMOS transistor $NT0_1$_, the latch circuit $LTC0_2$ and bit line BL0 are connected by the nMOS transistor $NT0_2$, and the latch circuit $LTC0_2$ and inverting bit line BL0_ are connected by the nMOS transistor $NT0_2$_.

Similarly, the latch circuits $LTC1_1$ and bit line BL1 are connected by the nMOS transistor $NT1_1$, the latch circuit $LTC1_1$ and inverting bit line BL1_ are connected by the nMOS transistor $NT1_1$_, the latch circuit $LTC1_2$ and bit line BL1 are connected by the nMOS transistor $NT1_2$, and the latch circuit $LTC1_2$ and inverting bit line BL1_ are connected by the nMOS transistor $NT1_2$_.

Further, the gates of the nMOS transistors $NT0_1$ and $NT1_1$ are connected to the signal line $SWL_1$, the gates of the nMOS transistors $NT0_1$_ and $NT1_1$_ are connected to the signal line $SWL_2$, the gates of the nMOS transistors $NT0_2$ and $NT1_2$ are connected to the signal line $SWL_3$, and the gates of the nMOS transistors $NT0_2$_ and $NT1_2$_ are connected to the signal line $SWL_4$.

In such a configuration, data is transferred from the SRAM cells to the latch circuits. The caching of the data to the flash memory cells connected to the bit lines and inverting bit lines is performed as follows:

First, for the flash memory cell MT0$i$ connected to the bit line BL0 and the flash memory cell MT1$i$ connected to the bit line BL1, the signal lines $SWL_1$ and $SWL_2$ are set to the low level and the signal lines $SWL_3$ and $SWL_4$ are set to the high level. Due to this, the SRAM data is transferred and latched at the latch circuits $LTC0_2$ and $LTC1_2$.

Similarly, for the flash memory cell MT0$i$_ connected to the bit line BL0_ and the flash memory cell MT1$i$_ connected to the bit line BL1_, the signal lines $SWL_1$ and $SWL_2$ are set to the high level and the signal lines $SWL_3$ and $SWL_4$ are set to the low level. Due to this, the SRAM data is transferred and latched at the latch circuits $LTC0_1$ and $LTC1_1$.

Next, in transferring the data latched in the latch circuits $LTC0_2$, $LTC1_2$, $LTC0_2$, and $LTC1_1$ to the flash memory cells MT0$i$, MT0$i$_, MT1$i$, MT1$i$_, the signal lines $SWL_1$ and $SWL_4$ are set to the low level and the signal lines $SWL_2$ and $SWL_3$ are set to the high level.

By this, the data latched at the latch circuit $LTC0_2$ is transferred to the flash memory cell MT0$_i$, the data latched at the latch circuit $LTC0_1$ is transferred to the flash memory MT0$i$_, the data latched at the latch circuit $LTC1_2$ is transferred to the flash memory cell MT1$i$, and the data latched to the latch circuit $LTC1_1$ is transferred to the flash memory MT$i$_.

As explained above, according to this embodiment, in addition to the effects of the second embodiment, there is the advantage that there is no need for writing data of a single word line of the flash memory divided into two operations and therefore a higher speed can be obtained.

As explained above, according to the present invention, it is possible to easily form a nonvolatile memory comprised of a buffer memory comprised of a DRAM or SRAM on a single chip, a flash memory, etc.

Accordingly, it is possible to realize a semiconductor nonvolatile memory device which is simple in configuration, can perform a read operation and a write operation at a high speed, and can store and hold data without the use of a backup power source.

Further, by providing at least two buffer memories and nonvolatile memories, it is possible to eliminate the erasure operation of the flash memory and write the data in the buffer memories.

Accordingly, it is possible to change the usual repetition of the input of the erasure signal→waiting for erasure→ input of write data→waiting for end of writing→waiting for input of write data→. . . to a repetition of input of write data→input of write data→. . .

Further, part of the nonvolatile memory may be used as an NVRAM. Therefore, during supply of power, it may be used as an SRAM and when the power is turned off it becomes a flash memory, so it is possible to realize, although partially, a substantially unlimited writing flash memory.

What is claim is:

1. A semiconductor nonvolatile memory device comprising:
   a first bit line;
   a second bit line;
   a buffer memory connected to said first and second bit lines;
   an electrically erasable programmable nonvolatile memory connected to said first and second bit lines;
   a writing latch circuit to which said first and second bit lines are connected in parallel and having a differential sensor type sense amplifier;
   a switching circuit for switching said nonvolatile memory and said writing latch circuit to a nonconnected state when said buffer memory is in operation, and switching said buffer memory and said writing latch circuit to a nonconnected state when said nonvolatile memory is in a writing or erasure operation;
   wherein said nonvolatile memory comprises:
      a first memory cell connected to a word line and said first bit line,
      a second memory cell connected to a word line common with said first memory cell and connected to said second bit line, and
      a means for holding the potential of either of said first and second bit lines at a first potential at a predetermined operation time and for setting the potential of the other bit line of said first and second bit lines to a second potential given a difference with the first potential for a predetermined time.

2. A semiconductor nonvolatile memory device as set forth in claim 1, wherein
   said nonvolatile memory comprises a plurality of memory cell blocks connected to said first and second bit lines, and
   selection transistors are connected in cascade in two stages between said memory cell blocks and said first and second bit lines and selection gates of the selection transistors are connected to a common selection gate line to selectively connect said memory cell blocks to said first and second bit lines.

3. A semiconductor nonvolatile memory device as set forth in claim 1, wherein said memory device comprises at least two buffer memories and nonvolatile memories.

4. A semiconductor nonvolatile memory device as set forth in claim 1, wherein the capacity of said buffer memory is set to a whole multiple of the size of the page to be written at one time in said nonvolatile memory.

5. A semiconductor nonvolatile memory device as set forth in claim 1, wherein said buffer memory comprises a static RAM.

6. A semiconductor nonvolatile memory device as set forth in claim 5, wherein when a power source is energized, the data is written into and read from said static RAM and when said power source is deenergized, the data held in said static RAM is evacuated to said nonvolatile memory.

7. A semiconductor nonvolatile memory device as set forth in claim 1, wherein the buffer memory comprises a dynamic RAM.

8. A semiconductor nonvolatile memory device comprising:
   a first bit line;
   a second bit line;
   a buffer memory connected to said first and second bit lines;
   an electrically erasable programmable nonvolatile memory connected to said first and second bit lines;
   a writing latch circuit to which said first and second bit lines are connected in parallel and having a differential sensor type sense amplifier;
   a switching circuit for switching said nonvolatile memory and said writing latch circuit to a nonconnected state when said buffer memory is in operation, and switching said buffer memory and said writing latch circuit to a nonconnected state when said nonvolatile memory is in a writing or erasure operation;
   wherein said nonvolatile memory comprises:
      a first memory cell connected to a word line and said first bit line,
      a second memory cell connected to a word line common with said first memory cell and connected to said second bit line, and
      a means for holding the potential of either of said first and second bit lines at a first potential at a predetermined operation time and for setting the potential of the other bit line of said first and second bit lines to a second potential given a difference with the first potential for a predetermined time, and
   wherein said memory device comprises at least two buffer memories and nonvolatile memories.

9. A semiconductor nonvolatile memory device as set forth in claim 8, wherein said buffer memory comprises a static RAM.

10. A semiconductor nonvolatile memory device as set forth in claim 9, wherein when a power source is energized, the data is written into and read from said static RAM and when said power source is deenergized, the data held in said static RAM is evacuated to said nonvolatile memory.

11. A semiconductor nonvolatile memory device as set forth in claim 8, wherein the buffer memory comprises a dynamic RAM.

12. A semiconductor nonvolatile memory device as set forth in claim 8, wherein
   said nonvolatile memory comprises a plurality of memory cell blocks connected to said first and second bit lines, and
   selection transistors are connected in cascade in two stages between said memory cell blocks and said first and second bit lines and selection gates of the selection transistors are connected to a common selection gate line to selectively connect said memory cell blocks to said first and second bit lines.

13. A semiconductor nonvolatile memory device comprising:
   a first bit line;
   a second bit line;
   a buffer memory connected to said first and second bit lines;
   an electrically erasable programmable nonvolatile memory connected to said first and second bit lines;
   a writing latch circuit to which said first and second bit lines are connected in parallel and having a differential sensor type sense amplifier;
   a switching circuit for switching said nonvolatile memory and said writing latch circuit to a nonconnected state when said buffer memory is in operation, and switching said buffer memory and said writing latch circuit to a nonconnected state when said nonvolatile memory is in a writing or erasure operation;

wherein the buffer memory and the nonvolatile memory are each of a folded bit line type memory configuration and both memories are connected through the same bit line; and wherein said nonvolatile memory comprises:
- a first memory cell connected to a word line and said first bit line,
- a second memory cell connected to a word line common with said first memory cell and connected to said second bit line, and
- a means for holding the potential of either of said first and second bit lines at a first potential at a predetermined operation time and for setting the potential of the other bit line of said first and second bit lines to a second potential given a difference with the first potential for a predetermined time.

14. A semiconductor nonvolatile memory device as set forth in claim 13, wherein said memory device comprises at least two buffer memories and nonvolatile memories.

15. A semiconductor nonvolatile memory device as set forth in claim 13, wherein the capacity of said buffer memory is set to a whole multiple of the size of the page to be written at one time in said nonvolatile memory.

16. A semiconductor nonvolatile memory device as set forth in claim 13, wherein said buffer memory comprises a static RAM.

17. A semiconductor nonvolatile memory device as set forth in claim 16, wherein when a power source is energized, the data is written into and read from said static RAM and when said power source is deenergized, the data held in said static RAM is evacuated to said nonvolatile memory.

18. A semiconductor nonvolatile memory device as set forth in claim 13, wherein the buffer memory comprises a dynamic RAM.

19. A semiconductor nonvolatile memory device as set forth in claim 13, wherein:

said nonvolatile memory comprises a plurality of memory cell blocks connected to said first and second bit lines, and selection transistors are connected in cascade in two stages between said memory cell blocks and said first and second bit lines and selection gates of the selection transistors are connected to a common selection gate line to selectively connect said memory cell blocks to said first and second bit lines.

20. A semiconductor nonvolatile memory device comprising:

a first bit line;

a second bit line;

a buffer memory connected to said first and second bit lines;

an electrically erasable programmable nonvolatile memory connected to said first and second bit lines;

a writing latch circuit to which said first and second bit lines are connected in parallel and having a differential sensor type sense amplifier;

a switching circuit for switching said nonvolatile memory and said writing latch circuit to a nonconnected state when said buffer memory is in operation, and switching said buffer memory and said writing latch circuit to a nonconnected state when said nonvolatile memory is in a writing or erasure operation;

wherein the buffer memory and the nonvolatile memory are each of a folded bit line type memory configuration and both memories are connected through the same bit line;

wherein said memory device comprises at least two buffer memories and nonvolatile memories; and wherein said nonvolatile memory comprises:
- a first memory cell connected to a word line and said first bit line,
- a second memory cell connected to a word line common with said first memory cell and connected to said second bit line,
- a means for holding the potential of either of said first and second bit lines at a first potential at a predetermined operation time and for setting the potential of the other bit line of said first and second bit lines to a second potential given a difference with the first potential for a predetermined time.

21. A semiconductor nonvolatile memory device as set forth in claim 20, wherein said buffer memory comprises a static RAM.

22. A semiconductor nonvolatile memory device as set forth in claim 21, wherein when a power source is energized, the data is written into and read from said static RAM and when said power source is deenergized, the data held in said static RAM is evacuated to said nonvolatile memory.

23. A semiconductor nonvolatile memory device as set forth in claim 20, wherein the buffer memory comprises a dynamic RAM.

24. A semiconductor nonvolatile memory device as set forth in claim 20, wherein:

said nonvolatile memory comprises a plurality of memory cell blocks connected to said first and second bit lines, and selection transistors are connected in cascade in two stages between said memory cell blocks and said first and second bit lines and selection gates of the selection transistors are connected to a common selection gate line to selectively connect said memory cell blocks to said first and second bit lines.

\* \* \* \* \*